LOGIC INVERTER CIRCUITS

Filed Feb. 14, 1961

INVENTORS.
ERNEST H. P. BIGO
PETER PLESHKO
BY John J. Goodwin
ATTORNEY

United States Patent Office 3,124,704

Patented Mar. 10, 1964

3,124,704

LOGIC INVERTER CIRCUITS

Ernest H. P. Bigo, Nutley, N.J., and Peter Pleshko, Bronx, N.Y., assignors to International Telephone and Telegraph Corporation, Nutley, N.J., a corporation of Maryland Filed Feb. 14, 1961, Ser. No. 89,290
10 Claims. (Cl. 307—88.5)

The present invention relates to logic inverter circuits and more particularly to a logic inverter circuit employing tunnel diodes.

An inverter is employed in digital logic systems to change the binary value of an input signal to an output signal of opposite binary value. For example, when the input signal is at ground potential, representing binary "one," the output signal will be negative, with respect to ground representing binary "zero," and vice-versa.

Heretofore logic inverter circuits have been devised utilizing vacuum tubes, junction and point contact transistors and magnetic cores. However, with the advent of tunnel diodes as logic elements it is desirable to provide a logic inverter employing tunnel diodes which will be compatible with other tunnel diode logic elements and offer the advantages of high speed operation in low voltage ranges obtainable with tunnel diodes.

An object of the present invention is to provide an inverter for performing high speed logical inversion functions using negative resistor devices, more particularly tunnel diodes.

The present invention includes a first and second path each having a negative resistance device connected in series with a fixed resistance. Binary valued input signals applied to the first path affect the resistance value of the negative resistance therein, which in turn controls the resistance state of the negative resistance in the second path. An output signal is derived from the second path which is the logical inverse of the input signal.

The present invention is explained with reference to the drawings in which.

Figure 1:
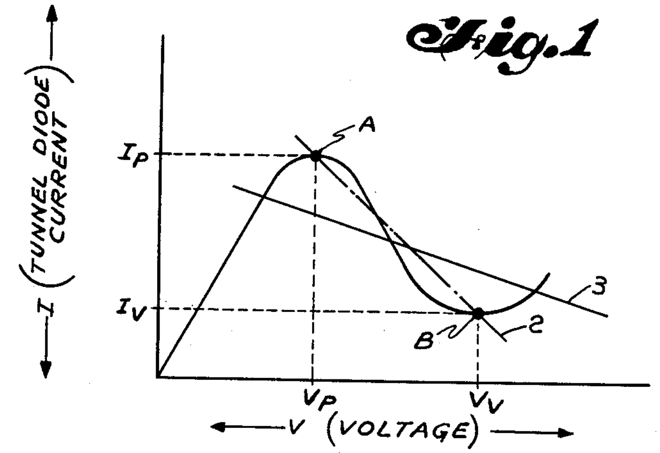
FIG. 1 is a curve of the operating conditions of a typical tunnel diode.

A tunnel diode is a broadband element exhibiting negative resistance over a portion of its operating curve, a typical operating curve being shown in FIG. 1. Referring to FIG. 1, the operating characteristic of a tunnel diode is shown by the curve of tunnel diode current (I) vs. voltage (V). The negative resistance portion of the tunnel diode operation is in the region lying between the first peak point A at which the voltage and current are designated $V_p$ and $I_p$ respectively (in accordance with the peak value of current at this point) and a second peak point B at which the voltage and current are designated $V_v$ and $I_v$ respectively (in accordance with the "valley" or minimal value of current at this peak point). The expression "negative resistance" is derived from the fact that there is a decrease in current for increasing voltage between the two peak points.

If the tunnel diode is operated in series with a resistor having a load line 2 of sufficiently high resistance, the tunnel diode will have two stable operating points at A and B separated by a region of instability. If the tunnel diode is biased to point A and is triggered with a current pulse, it can be made to switch to point B. For the tunnel diode represented by the characteristic shown in FIG. 1, an enabling voltage $V_s$ is necessary to cause a current $I_p$ to flow through the tunnel diode and the series resistor represented by load line 2. When current $I_p$ occurs, the tunnel diode will switch from point A to point B and the resistance of the tunnel diode will increase from $R_{td}=V_p/I_p$ to $R_{td}=V_v/I_v$ which, for a typical germanium tunnel diode, is approximately sixty times the former resistance. It is to be noted that if the resistance in series with the tunnel diode were greater, as represented by load-line 3, the application of the same enabling voltage $V_s$ will produce a current less than $I_p$ and the tunnel diode will not switch.

Figure 2:
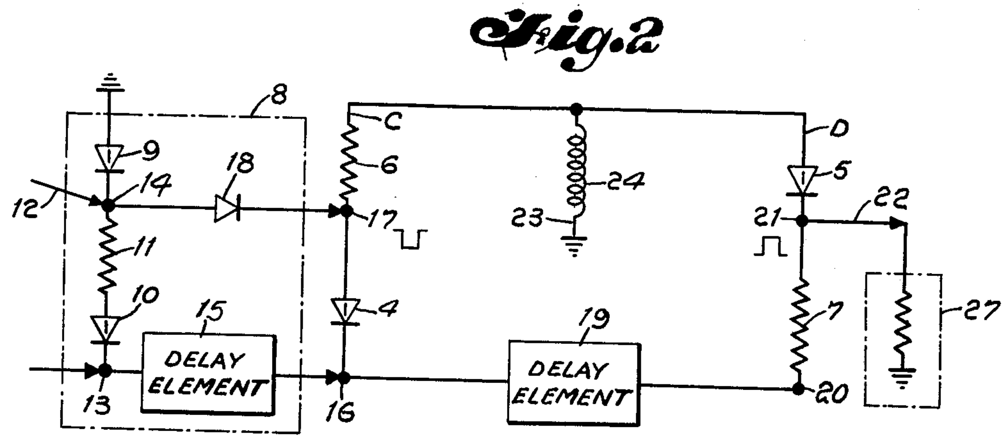
FIG. 2 is a schematic of a preferred embodiment of a logic inverter following the principles of the present invention.

The above-stated characteristics of the tunnel diode may be utilized to effect a logical inverter circuit. Referring to FIG. 2, a tunnel diode inverter is shown comprising first and second paths, designated C and D, each of said paths including a negative resistance device (tunnel diodes 4 and 5) in series with a fixed resistance (resistors 6 and 7, respectively). A current source 24 is coupled to the paths at one end, and output means 22 is connected to junction 21 between negative resistance device 5 and fixed resistance 7. Current source 24 may be an inductance coil whose storage characteristics can be used to produce a switching current. Resistor 6 and tunnel diode 5 are directly coupled to inductance coil 24. Tunnel diode 4 is directly coupled to the other end of resistor 6 at junction 17 and resistor 7 is directly coupled to the tunnel diode 5 at junction 21. A delay element 19 is coupled to tunnel diode 4 at junction 16 and to resistor 7 at junction 20.

Consider tunnel diodes 4 and 5 in their first stable states (point A in FIG. 1). Resistors 6 and 7 are equal in value, such value being slightly greater than the value $R_s$ necessary to permit switching of the tunnel diodes upon the application of a voltage $V_s$, as discussed hereinabove. For example, the value of resistors 6 and 7 may be 1.1 $R_s$. It is to be noted that this resistive value is much greater (for example, six times greater) relative to the resistance of the tunnel diodes when in the low resistance stable condition represented by point B, FIG. 1.

A common method of representing binary-intelligence is to have a negative potential signal, for example $-V_s$, represent logic "zero" and a ground potential signal represent logic "one." The present invention, in cooperation with a suitable gating circuit, accepts "zero" and "one" logic inputs in the form of negative ($-V_s$) and ground potential signals and inverts them to provide logic "one" and "zero" output signals respectively.

The binary valued input signals are applied to the inverter through a suitable input circuit. For purposes of explanation the suitable input circuit is a logic circuit also employing tunnel diodes. The input logic circuit 8 shown includes two tunnel diodes 9 and 10 separated by a resistance 11. When tunnel diode 9 is in its high resistance condition tunnel diode 10 is in its low resistance condition, and vice-versa, as determined by a priming signal on conductor 12. The difference in resistance between the high and low resistance condition of a typical tunnel diode is in the order of sixty to one, so that the voltage drop across the tunnel diode in the low resistance state may be neglected with respect to the voltage drop across the tunnel diode in the high resistance state.

An enabling voltage pulse, for example $-V_s$, is applied to point 13. If the tunnel diodes have been primed (from the signal on conductor 12) such that tunnel diode 9 is in its high resistance condition and tunnel diode 10 is in its low resistance condition, then the potential at point 14 becomes $-V_s$. If tunnel diode 10 is at high resistance and tunnel diode 9 is at low resistance, then the potential at point 14 becomes ground. The $-V_s$ potential condition at point 14 represents logic "zero" and the ground condition at said point indicates logic "one." The voltage pulse $-V_s$ passes through a delay element 15 (for example, an L-C delay line) and is applied to point 16 of the inverter. The slight delay is equal to the operating time of the logic circuit 8, permitting the $-V_s$ pulse at point 16 to occur simultaneously with the potential condition at point 14. Point 14 is connected to point 17 of the inverter through diode 18. Therefore, if point 14 where at $-V_s$ (logic zero) diode 18 would be back-biased and no current would be applied at point 17; however when point 14 is at ground potential (logic "one"), diode 18 does conduct and current is applied to point 17. An example of a logic circuit which operates in a manner described for input circuit 8 may be seen by reference to application Serial Number 50,485 to R. C. P. Hinton et al., filed August 18, 1960, and assigned to the assignee of the present application.

The inverter inputs are therefore: a voltage pulse ($-V_s$) at point 16 and a positive current at point 17 for logic "one" and a voltage pulse ($-V_s$) at point 16 and no current at point 17 for logic "zero."

When a logic "zero" input signal is applied to the inverter circuit, that is, when a voltage pulse $-V_s$ is applied to point 16 and no current is supplied to point 17, resistance 6 being greater than $R_s$, the current produced by voltage pulse $-V_s$ will be insufficient to switch tunnel diode 4, and the circuit conditions of the inverter remain undisturbed. The voltage pulse $-V_s$ passes through delay element 19 (to be more fully explained hereinbelow) and appears at point 20. Since tunnel diode 5 is in its first stable condition, its resistance is much lower than resistance 7 and may be neglected. The drop of voltage pulse $-V_s$ appears almost entirely across resistance 7, placing point 21 approximately at ground potential, representative of logic "one." Inversion has, therefore occurred, and the logic "one" pulse is available on output conductor 22.

With a logic "one" input signal to the inverter, that is, when a voltage pulse $-V_s$ is applied to point 16 and current is supplied to point 17, the current at point 17 combined with the current produced by voltage pulse $-V_s$ at point 16 is sufficient to switch tunnel diode 4. When tunnel diode 4 switches, it will operate at point B on the operating characteristic shown in FIG. 1. Upon switching, the resistance of tunnel diode 4 increases from a negligible value to a value much greater than resistance 6. For example, a germanium tunnel diode's resistance may increase by a factor of sixty, becoming ten times larger than $R_s$. The increase in resistance of tunnel diode 4 causes a sharp decrease in current between point 16 and ground level 23. This sharp current decrease causes a back E.M.F. to be produced in inductor 24, which in turn causes a sharp current increase in the path of tunnel diode 5, this being the lower resistance path, the ground return being through conductor 22 to a typical load impedance 27. Delay element 19 delays the occurrence of voltage pulse $-V_s$ at point 20 an amount equal to the time required for inductor 24 to produce the current surge to tunnel diode 5. Delay element 19 may be an L-C delay line. With the additional current surge, switching of tunnel diode 5 now occurs, thereby increasing the resistance of tunnel diode 5 an amount such that resistance 7 is relatively small and may be neglected. The drop of voltage pulse $-V_s$ now appears almost entirely across tunnel diode 5, putting point 21 and output conductor 22 at potential $-V_s$, which represents logic "zero," and which is the inverse of the applied logic "one" signal.

It is seen that the selective switching operation of the tunnel diodes in the unique arrangement as shown provides logic inversion of binary valued input signals at high speed and at low voltage levels. It is to be noted that in the discussion hereinabove the capacitance of the tunnel diodes were neglected since the resulting impedance of the tunnel diode due to the capacitance is negligible with respect to the resistances discussed. The capacitive delay could contribute to the tunnel diode switching time for sharply changing input voltage pulses, however this also does not concern the present invention since the rate of change of the input pulses are within acceptable limits.

Load impedance 27 is a schematic equivalent of a typical utilization device which may accept the inverted logic signals. In many instances it is desirable to produce a series of logic inversions by coupling in series a plurality of inverters as shown in either FIG. 2 or FIG. 3. The output signal from conductor 22 is applied to a point similar to point 17 on succeeding inverter stages while the enabling voltage pulse $-V_s$ from point 20 is applied to a point similar to point 16 on the succeeding stages where the binary valued logic signal may be inverted and reinverted through a plurality of such inverter stages. The only requirement for such series operation is that the current taken from conductor 22 for the next stage, plus the current which passes through resistor 7 be less than the peak current of tunnel diode 5, or else the untimely switching of tunnel diode 5 would result.

Figure 3:
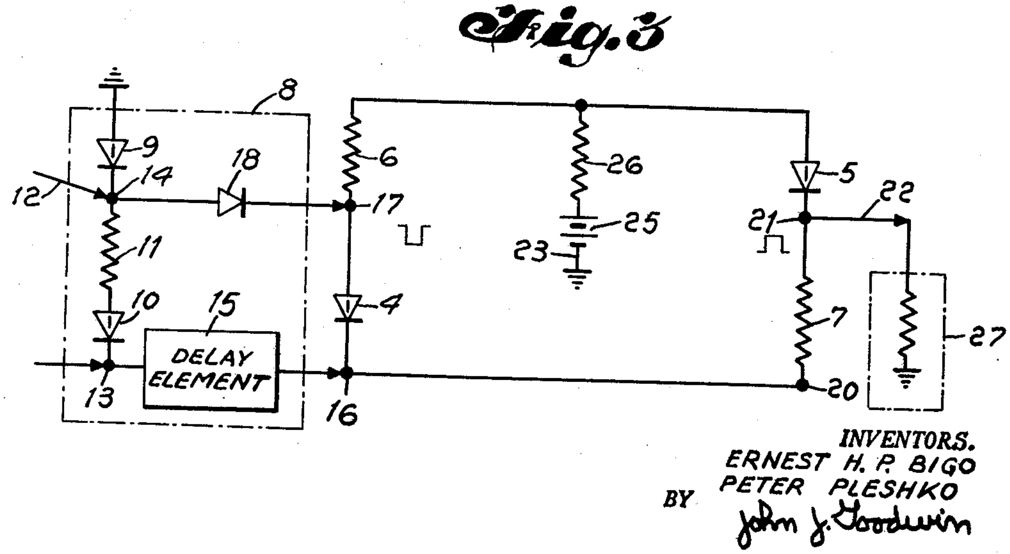
FIG. 3 is a schematic of another embodiment of a logic inverter following the principles of the present invention.

Referring to FIG. 3, another embodiment of the present invention is shown wherein the provision of a delay element is not required. The embodiment shown in FIG. 3 is identical with that of FIG. 2 with the exception that delay element 19 is removed and inductor 24 is replaced by battery 25 in series with resistance 26. The operation of the gating circuit preceding the inverter of FIG. 3 is the same as described hereinabove for the inverter of FIG. 2, that is, for a logic "zero" input signal point 16 will have voltage pulse $-V_s$ applied thereat and point 17 will receive no current and for a logic "one" input signal point 16 will be at $-V_s$ while point 17 will receive current.

For a logic "zero" input signal the voltage pulse $-V_s$ at point 16 will not produce sufficient current to switch tunnel diode 4 and the circuit conditions will remain unchanged, that is tunnel diodes 4 and 5 will remain in their first stable (low resistance) states. Since voltage pulse $-V_s$ also instantly appears at point 20, and since the voltage drop across tunnel diode 5 can be neglected with respect to the drop across resistance 7, point 21 and output conductor 22 will appear at battery potential (slightly above ground potential), which is representative of logic "one."

For a logic "one" input signal voltage pulse $-V_s$ is applied to point 16 and current will be applied to point 17 sufficient to switch tunnel diode 4, which immediately presents a high resistance consequently causing current to flow from battery 25 through resistance 26 to tunnel diode 5 (and through conductor 22 to ground). Tunnel diode 5 switches, also presenting a high resistance so that the voltage pulse $-V_s$ at point 20 appears, neglecting the now relatively small value of resistance 7, across tunnel diode 5. Point 21 and output conductor 22 are approximately at potential $-V_s$, representing logic "zero." The circuit of FIG. 3 eliminates the need for a delay element as shown in FIG. 2, but does require a battery supply.

It is seen from the above discussion the novel logic inverter has been developed which utilize the negative resistance properties of tunnel diodes. The inverter may be driven from presently available logic gates, will invert at high speed, and will operate with relatively low driving voltage.

While we have described above the principles of our invention in connection with specific apparatus, it is to be clearly understood that this description is made only by way of example and not as a limitation to the scope of our invention as set forth in the objects thereof and in the accompanying claims.

We claim:

1. A circuit for logically inverting binary valued input signals comprising first and second paths, each of said paths including a negative resistance device in series with a fixed resistance with the fixed resistance of one path and the negative resistance device of the other path being nearest one end of each of said paths, each of said negative resistance devices being in an initially low resistance state and adapted to exhibit a high resistance state upon being switched by a given current, a current source coupled to said pair of paths at said one end, an output means connected at the junction of said negative resistance device and said fixed resistance of said second path, means for applying a voltage to said first and second paths at the other end thereof opposite said current source whereby said voltage appears substantially across said fixed resistance of said second path causing said output means to be at a first potential, and means to switch the negative resistance device in said first path to its high resistance state thereby causing an increased current in said second path for switching said negative resistance device therein to its high resistance state whereby said voltage appears substantially across said negative resistance device of said second path causing said output means to be at a second potential.

2. A circuit according to claim 1 wherein said negative resistance devices are tunnel diodes.

3. A circuit according to claim 1 wherein said current source is an inductance coil.

4. A circuit according to claim 1 wherein said current source is a battery connected in series with a resistor.

5. A circuit for logically inverting binary valued input signals comprising an inductance coil, a first resistor and a first tunnel diode coupled at one end to one end of said inductance coil, the other end of said inductance coil being coupled to a reference level, a second tunnel diode coupled to the other end of said first resistor, a second resistor coupled to the other end of said first tunnel diode, said first and second tunnel diodes being initially in their low resistance state, an output conductor coupled to the junction of said first tunnel diode and said second resistor, means for applying a given voltage across said second tunnel diode and said first resistor and across said first tunnel diode and said second resistor, said given voltage appearing substantially across said first and second resistors, placing said output conductor substantially at said reference level, means to apply a current to said second tunnel diode, said current switching said second tunnel diode to its high resistance state thereby causing a decrease in current through said first resistor, said decrease in current through said first resistor causing an increase in current to be produced by said inductance coil and applied to said first tunnel diode which switches to its high resistance state, placing said output conductor substantially at said given voltage value.

6. A circuit for logically inverting binary valued input signals comprising a battery, one end of which being coupled to a reference level, a first resistor coupled to the other end of said battery, a second resistor and a first tunnel diode coupled at one end to said first resistor at the end opposite said battery, a second tunnel diode coupled at one end to the other end of said second resistor, a third resistor coupled at one end to the other end of said first tunnel diode, said second diode and third resistor being coupled together at the other ends thereof, said first and second tunnel diodes being initially in their low resistance state, an output conductor coupled to the junction of said first tunnel diode and said third resistor, means for applying a given voltage across said second tunnel diode and said second resistor and across said third resistor and said first tunnel diode, said given voltage initially appearing substantially across said second and third resistors, placing said output conductor substantially at said battery voltage, means to apply a current to said second tunnel diode, said current switching said second tunnel diode to its high resistance state thereby causing an increase in current to said first tunnel diode from said battery, said current increase switching said first tunnel diode to its high resistance state, placing said output conductor substantially at said given voltage value.

7. A circuit for logically inverting binary valued input signals comprising first and second paths each including a negative resistance element in series with a fixed resistance element, said negative resistance elements being variable from a low to a high resistance state with respect to said fixed resistance in response to a given current and each being initially in the same one of said states, an output means coupled to the junction of said negative and fixed resistance elements of said second path, a current producing means coupled to said first and second paths at one end of said paths, means applying an enabling signal to said first and second paths at the other end of said paths, and current control means coupled to the junction of said negative and fixed resistance elements of said first path to selectively apply one of two potential conditions to said first path junction, the first of said potentials being the enabling signal and the other being a reference condition, the application of one of said potentials causing the second potential to appear at the output and the application of the second said potential causing said negative resistance elements to switch to the other of said states and cause said one potential to appear at said output.

8. A circuit according to claim 7 wherein said current producing means at one end is connected to said fixed resistance of said first path and said negative resistance of said second path, and said means applying said enabling signal at the other end is connected to said negative resistance of said first path and said fixed resistance of said second path.

9. A circuit according to claim 8 wherein each negative resistance element is initially in a low resistance state and said current control means applies said first potential, said first potential appearing across said fixed resistances and said other potential appearing at said output.

10. A circuit according to claim 9 wherein each said negative resistance element is initially in a low resistance state and said current control means applies said other potential causing said first negative resistance element to switch to a high resistance state and said current producing means to switch said second negative resistance element to a high resistance state, whereby said first potential appears at said output.

References Cited in the file of this patent

I.B.M. Technical Disclosure Bulletin, vol. 3, No. 9, February 1961.